(12) United States Patent
Yu

(10) Patent No.: US 6,555,458 B1
(45) Date of Patent: Apr. 29, 2003

(54) FABRICATING AN ELECTRICAL METAL FUSE

(75) Inventor: Ta-Lee Yu, Hsinchu (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 0 days.

(21) Appl. No.: 10/046,802

(22) Filed: Jan. 14, 2002

(51) Int. Cl.⁷ ............................................. H01L 29/00
(52) U.S. Cl. ...................................... 438/601; 438/132
(58) Field of Search ................................ 438/601, 132, 438/129–131

(56) References Cited

U.S. PATENT DOCUMENTS 6,261,873 B1 * 7/2001 Bouldin et al. ............. 438/132
6,333,546 B1 * 12/2001 Marmillion et al. ........ 257/529

* cited by examiner

*Primary Examiner*—Jey Tsai
(74) *Attorney, Agent, or Firm*—Tung & Associates

(57) ABSTRACT

A method for forming an electrical metal fuse for use with a semiconductor integrated circuit device. At least two varying trench metal depths may be formed on a substrate to configure the electrical metal fuse thereon. Additionally, at least two different widths of single metal lines, may be configured on the substrate. As a result of the two different trench depths and two different widths of metal formed thereon to create the electrical metal fuse, increases in current density gradients and thermal gradients thereof can be generated. The trench metal depths and width of metal are formed from copper. The electrical metal fuse generally comprises a current density ratio greater than 10 to 1.

12 Claims, 2 Drawing Sheets

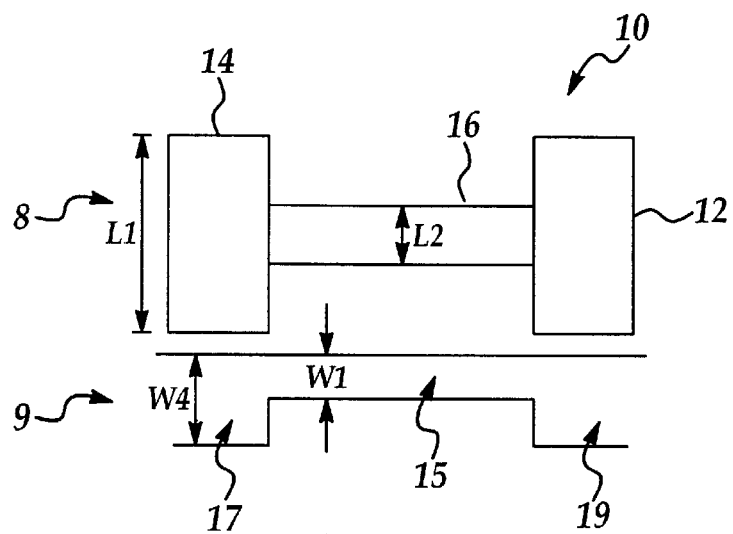
*Figure 1*
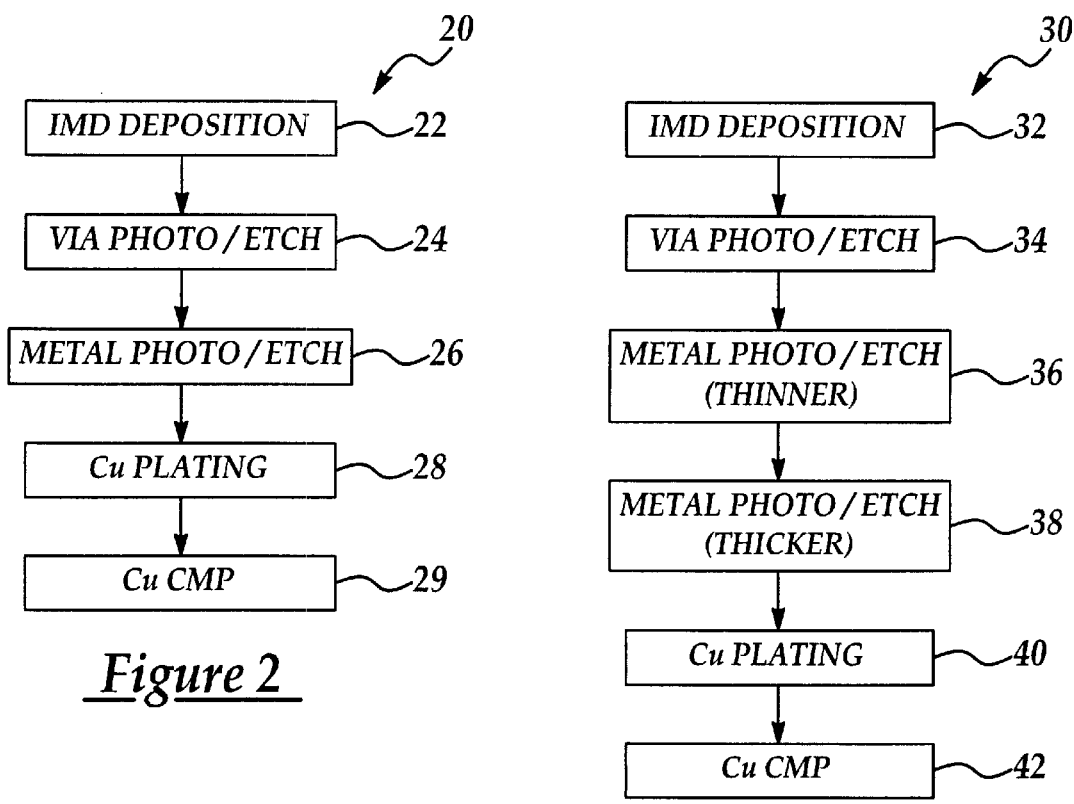
*Figure 2*
*Figure 3*

FABRICATING AN ELECTRICAL METAL FUSE

TECHNICAL FIELD

The present invention relates generally to semiconductor fabrication methods and systems. The present invention also relates to semiconductor fuses and methods for fabricating such semiconductor fuses.

BACKGROUND OF THE INVENTION

Some types of integrated circuitry utilize fuses. A fuse is a structure, which can be broken down or blown in accordance with a suitable electrical current, which is provided through the fuse to provide an open circuit condition. Within the context of integrated circuitry memory devices, fuses can be used to program in redundant rows of memory. Fuses have use in other integrated circuitry applications as well. Semiconductor fusible links are used for both activating redundancy in memory chips and for programming functions and codes in logic chips. Typical fusible links are large structures blown by heat, e.g. from a laser, or from electrical current passed through the fuse.

Many integrated circuits such as dynamic random access memory (DRAM) and static random access memory (SRAM) employ fuses. Such fuses can provide for redundancy for the purpose of preventing reduction of yield of the semiconductor devices, which may be caused by random defects generated in the manufacturing process. The redundant circuit portion is provided as a spare circuit portion having the same function as a specific circuit portion so that the specific circuit portion, which has a defect caused during manufacturing may be replaced with the redundant circuit in order to maintain the function of the entire semiconductor. Moreover, fuse links provide for voltage options, packaging pin out options, or any other option desired by the manufacturer to be employed prior to the final processing. This helps increase yield and makes it easier to use one basic design for several different end products.

In the fabrication of integrated circuit (IC) structures, fusible links (i.e., fuses) thus play an important role in improving the yield of the fabrication process. In general, as indicated above, it is desirable to provide redundancy in certain elements of the circuitry of an electronic component and the faulty element could be removed via a fuse and the component still be used. Two types of such fuses are in use. In one type, the fuse element is blown using an external heat source, e.g., laser beam. In a second type, flowing an electrical current through the fuse element generally blows the fuse. Electrical fuses are preferred as the fuse blow operation could be automated with a circuit test.

Three paramount requirements for a fuse are: a) material and process compatibility with thin film processes used to make the component; b) be capable of a clean blow meaning that a minimal amount of residue is left after the blow; and c) voltage compatibility with the circuitry used if an electrical blow is used.

The rapid increase of hand held IC devices has opened up a new world of low voltage circuitry for weight and power conservation. These type IC devices require a fuse, which could be blown clean at or below 2.5 V. The low power circuitry also requires very high conductivity interconnection lines in the device. To meet this requirement, copper metallurgy is the preferred choice; which, in turn, mandates use of a Damascene process to make the device. Aluminum may also be employed to form the interconnection lines using known procedures.

In general, multilayer electronic components comprise multiple layers of a dielectric material having metallization on each layer in the form of vias, pads, straps connecting pads to vias and wiring. Vias or other openings in the dielectric layer extend from one layer to another layer. These openings are filled with a conductive material and electrically connect the metallization on one layer to the metallization on another layer and provide for the high density electronic components devices now used in industry.

An important aspect of multilayer electronic components is the via or openings between layers in which a conductive material is applied to provide electrical contact between the metallization on different layers. Broadly stated, the typical multilayer electronic component is built up from a number of layers of a dielectric material layer such as silicon oxide, fluorinated silicon oxide, polymers including polyimide and fluorinated polyimide, ceramics, carbon and other dielectric materials. In the processing sequence known in the art as the "Damascene Process", the dielectric layer is patterned using known techniques such as the use of a photoresist material, which is exposed to define the wiring pattern. After developing, the photoresist acts as a mask through which a pattern of the dielectric material is removed by a subtractive etch process such as plasma etching or reactive ion etching. This is generally termed a lithography or photolithography process or operation and may be used for both additive or subtractive metallization procedures as is known in the art.

Using the Damascene Process, openings defining wiring patterns are provided in the dielectric layer, extending from one surface of the dielectric layer to the other surface of the dielectric layer. These wiring patterns are then filled with a metallization metal using a filling technique such as electroplating, electroless plating, chemical vapor deposition, physical vapor deposition or a combination of methods. This process may include planarization of the metal on the surface of the dielectric by removing excess metallization with a method such as chemical mechanical polishing (CMP).

In the single damascene process, vias or openings are additionally provided in the dielectric layer and filled with metallization to provide electrical contact between layers of wiring levels. In the dual damascene process, the via openings and the wiring pattern openings are both provided in the dielectric layer before filling with metallization. This process simplifies the procedure and eliminates some internal interfaces. These procedures are continued for each layer in the electronic component until the electronic component is completed.

In the formation of current laser metal fuse structures, one of the main problems that manufacturers encounter is the requirement of large spaces and a very complex processing operation, particularly involving copper. In addition, metal fuse rules are limited to particular restrictive values. Based on the foregoing, the present inventor has concluded that a need exists to reduce the space required in the formation of electrical metal fuses used in integrated circuit devices. The present inventor has also concluded that a need exists to reduce the processing complexity for copper based fabrication processes involved in the formal of electrical metal fuses. Finally, the present inventor recognizes that a need exists for methods and devices thereof that result in the generation of increased current density gradients and thermal gradients associated with electrical metal fuse structures. These needs and other goals can thus be met through the implementation of the methods and devices of the present invention disclosed herein.

BRIEF SUMMARY OF THE INVENTION

The following summary of the invention is provided to facilitate an understanding of some of the innovative features unique to the present invention, and is not intended to be a full description. A full appreciation of the various aspects of the invention can be gained by taking the entire specification, claims, drawings, and abstract as a whole.

It is therefore one aspect of the present to provide an improved semiconductor manufacturing method and device thereof.

It is another aspect of the present invention to provide an improved method for forming an electrical metal fuse for use with semiconductor integrated circuit devices.

It is still another aspect of the present invention to provide a fuse structure having at least two different trench depths of copper to generate more current density gradients and thermal gradients thereof.

It is yet another aspect of the present invention to provide a fuse structure having at least two different widths of single copper lines to generate more current density gradients and thermal gradients thereof.

The above and other aspects of the present invention can thus be achieved as is now described. A method for forming an electrical metal fuse for use with a semiconductor integrated circuit device. At least two varying trench metal depths may be formed on a substrate to configure the electrical metal fuse thereon. Additionally, at least two different widths of single metal lines, may be configured on the substrate. As a result of the two different trench depths and two different widths of metal formed thereon to create the electrical metal fuse, increases in current density gradients and thermal gradients thereof can be generated. The trench metal depths and width of metal are formed from copper. The electrical metal fuse generally comprises a current density ratio greater than 10 to 1. The electrical metal fuse is generally formed as a result of an intermetal dielectric (IMD) deposition operation, followed by a via photolithography and etch operation. Thereafter, a metal photolithography and etch operation is performed to form a thinner layer. A metal photolithography and etch operation can additionally be performed to create a thinner layer upon the substrate. A copper plating operation can then be performed upon the substrate followed by a Chemical Mechanical Polishing (CMP) operation.

BRIEF DESCRIPTION OF THE DRAWINGS

The accompanying figures, in which like reference numerals refer to identical or functionally-similar elements throughout the separate views and which are incorporated in and form part of the specification, further illustrate the present invention and, together with the detailed description of the invention, serve to explain the principles of the present invention.

FIG. 1 illustrates top and cross-sectional views of a fuse structure, in accordance with a preferred embodiment of the present invention;

FIG. 2 depicts a flow chart of operations illustrating process steps that may be implemented in accordance with a preferred embodiment of the present invention;

FIG. 3 illustrates a flow chart of operations illustrating process steps that may be implemented in accordance with a preferred embodiment of the present invention;

DETAILED DESCRIPTION OF THE INVENTION

Figure 4:
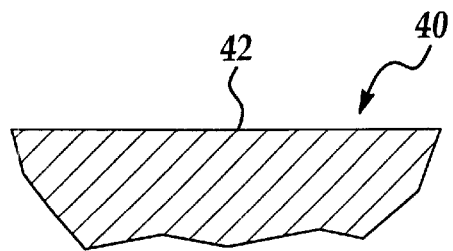
FIG. 4 depicts a first semiconductor processing step that may be implemented to fabricate an electrical fuse, in accordance with a preferred embodiment of the present invention.

The particular values and configurations discussed in these non-limiting examples can be varied and are cited merely to illustrate embodiments of the present invention and are not intended to limit the scope of the invention.

FIG. 1 illustrates a top view 8 and a cross sectional view 9 of a fuse structure 10, in accordance with a preferred embodiment of the present invention. Fuse structure 10 thus can form an electrical metal fuse utilized in semiconductor integrated circuit devices. At least two varying trench metal depths can be formed on a substrate to configure an electrical metal fuse thereon. Two different trench depths of copper are formed to generate more current density gradients and thermal gradients.

In FIG. 1, a first length L1 of metal structure 14 (i.e., which may be configured from copper) is illustrated. Additionally, a second length L2 of metal structure 16 is depicted in FIG. 1. Metal structure 12 is analogous to metal structure 14 and possesses the same length, L1. Metal structure 16 generally comprises a fuse region formed from a thin metal. Fuse region 16 may have a depth (i.e., length) for example of approximately 0.2 $\mu$m. Length L2 for example, may have a length of 0.5 $\mu$m.

Additionally, at least two different widths of single metal lines may be configured to form fuse structure 10, thereby generating increases in current density gradients and thermal gradients thereof. Such widths are particularly illustrated in cross sectional view 9, in which a width W1 illustrated and a width W2 is also depicted. Width W2 comprises a width that is thinner than width W1.

Thus, region 17 comprises a thicker region, while region 15 comprises a thinner region. Width W1 can be, for example, approximately 9 K, while width W2 can be, for example, approximately 3.5 K. Region 19 is generally analogous to region 17. Regions 17, 15 and 19 are formed from copper. The configuration illustrated in FIG. 1 contains a current density ratio that is greater than 10:1, which depends on a width ratio.

FIG. 2 depicts a flow chart 20 of operations illustrating process steps that may be implemented in accordance with a preferred embodiment of the present invention. As illustrated at block 22, an intermetal dielectric (IMD) deposition operation may be performed to deposit an IMD layer upon a substrate. Thereafter, as indicated at block 24, a via photolithography and etch operation may be performed upon the substrate.

Next, as indicated at block 26, a metal photolithography and etch operation may be performed upon the substrate, followed thereafter, as depicted at block 28, by a copper plating operation. Finally, as illustrated at block 29, a copper Chemical Mechanical Polishing (CMP) operation may be performed upon the substrate to form an electrical metal fuse structure, such as the electrical metal fuse structure illustrated in FIG. 1.

FIG. 3 illustrates a flow chart of operations illustrating process steps that may be implemented in accordance with a preferred embodiment of the present invention. As illustrated at block 32, an intermetal dielectric (IMD) deposition operation may be performed to deposit an IMD layer upon a substrate. Thereafter, as indicated at block 34, a via photolithography and etch operation may be performed upon the substrate.

Next, as indicated at block 36, a metal photolithography and etch operation may be performed to form a thinner layer or region. n example of such a thinner region is region 15 of FIG. 1. A metal photolithography and etch operation may also be performed, as indicated at block 38, to create a thicker region or layer. An example of such a thicker region is region 17 and/or region 19 of FIG. 1. A copper plating operation may then be performed upon the substrate, as depicted at block 40, followed by a Chemical Mechanical Polishing operation, as indicated at block 42.

An electrical metal fuse, such as, for example fuse structure 10 of FIG. 1 can thus be formed as a result of the operational steps illustrated in FIG. 3. Note that a single metal plating is generally utilized to deposit a metal of different thickness. The process described herein for forming an electrical metal fuse can be utilized for single or dual damascene semiconductor manufacturing processes.

Figure 5:
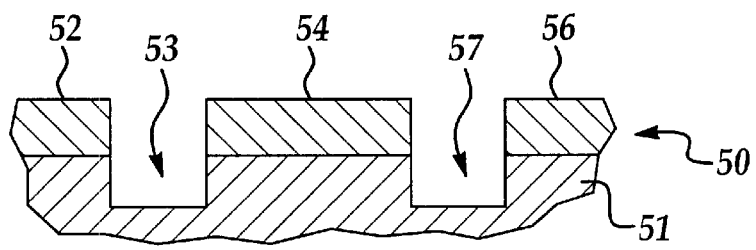
FIG. 5 illustrates a second semiconductor processing step that may be implemented to fabricate an electrical fuse, in accordance with a preferred embodiment of the present invention.

FIG. 4 depicts a first semiconductor processing step 40 that may be implemented to fabricate an electrical fuse (e.g., fuse structure 10 of FIG. 1), in accordance with a preferred embodiment of the present invention. In processing step 40, an intermetal dielectric (IMD) layer 42 is formed on a substrate. FIG. 5 illustrates a second semiconductor processing step 50 that may be implemented to fabricate an electrical fuse, in accordance with a preferred embodiment of the present invention. In processing step 50, photoresist layers 52, 54, and 56 may be formed. FIG. 5 generally illustrates a photolithography and etching operation for forming trenches 53 and 57.

Figure 6:
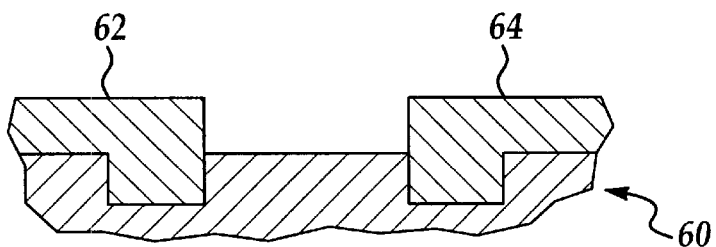
FIG. 6 depicts a third semiconductor processing step that may be implemented to fabricate an electrical fuse, in accordance with a preferred embodiment of the present invention.

FIG. 6 depicts a third semiconductor processing step 60 that may be implemented to fabricate an electrical fuse, in accordance with a preferred embodiment of the present invention. FIG. 6 illustrates the formation of regions 62 and 64 which can be implemented as a result of an additional photolithography and/or etch operation.

Figure 7:
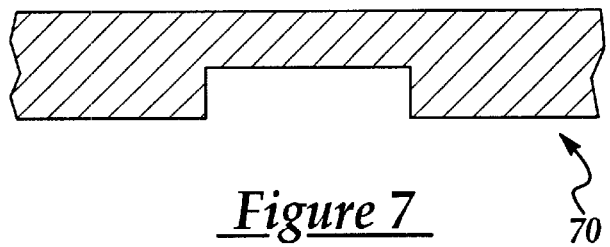
FIG. 7 illustrates a fourth semiconductor processing step that may be implemented to fabricate an electrical fuse, in accordance with a preferred embodiment of the present invention.

FIG. 7 illustrates a fourth semiconductor processing step 70 that may be implemented to fabricate an electrical fuse, in accordance with a preferred embodiment of the present invention. Photoresist layers 52, 54, and 56 are thus removed as a result of the photolithography and etch operations described above. A copper plating operation is thus performed, followed by a copper CMP operation, as indicated in FIG. 7.

Based on the foregoing, it can be appreciated that the present invention disclosed herein generally describes a method for forming an electrical metal fuse for use with a semiconductor integrated circuit device. At least two varying trench metal depths may be formed on a substrate to configure the electrical metal fuse thereon. Additionally, at least two different widths of single metal lines, may be configured on the substrate. As a result of the two different trench depths and two different widths of metal formed thereon to create the electrical metal fuse, increases in current density gradients and thermal gradients thereof can be generated.

The trench metal depths and width of metal are formed from copper. The electrical metal fuse generally comprises a current density ratio greater than 10 to 1. The electrical metal fuse is generally formed as a result of an intermetal dielectric (IMD) deposition operation, followed by a via photolithography and etch operation. Thereafter, a metal photolithography and etch operation is performed to form a thinner layer. A metal photolithography and etch operation can additionally be performed to create a thinner layer upon the substrate. A copper plating operation can then be performed upon the substrate followed by a Chemical Mechanical Polishing (CMP) operation.

The embodiments and examples set forth herein are presented to best explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered. The description as set forth is thus not intended to be exhaustive or to limit the scope of the invention. Many modifications and variations are possible in light of the above teaching without departing from scope of the following claims. It is contemplated that the use of the present invention can involve components having different characteristics. It is intended that the scope of the present invention be defined by the claims appended hereto, giving full cognizance to equivalents in all respects.

What is claimed is:

1. A method for forming an electrical metal fuse for use with a semiconductor integrated circuit device, said method comprising the steps of:

forming at least two varying trench metal depths of a metal on a substrate to configure an electrical metal fuse thereon; and thereafter configuring at least two different widths of single metal lines of a metal to thereby generate increases in current density gradients and thermal gradients thereof, wherein said electrical metal fuse comprises a current density ratio greater than 10:1.

2. The method of claim 1 wherein said metal of said at least two different widths of single metal lines comprises copper.

3. The method of claim 1 wherein said at least two varying trench metal depths comprises at least two varying trench depths of copper for use in forming said electrical metal fuse upon said substrate.

4. The method of claim 1 wherein said at least two different widths of single metal lines of a metal comprises at least one metal width that is thinner than at least one other metal width thereof.

5. The method of claim 1 further comprising the step of:

depositing at least one intermetal dielectric (IMD) layer upon said substrate.

6. The method of claim 5 further comprising the step of:

thereafter performing a via photolithography operation followed by an etch operation upon said substrate.

7. The method of claim 6 further comprising the steps of:

thereafter performing a metal photolithography operation upon said substrate; and thereafter performing an etch operation upon said substrate.

8. The method of claim 7 further comprising the step of:

depositing a copper plating upon said substrate; and thereafter performing a copper Chemical Mechanical Polishing (CMP) operation upon said substrate.

9. The method of claim 8 wherein the step of thereafter performing a metal photolithography and etch step upon said substrate, further comprises the step of:

performing a metal photolithography and etch step upon said substrate to deposit a thin layer thereof upon said substrate; and performing a metal photolithography and etch step upon said substrate to deposit a thick layer thereof upon said substrate.

10. The method of claim 1 further comprising the steps of:

depositing at least one intermetal dielectric (IMD) layer upon said substrate;

thereafter performing a via photolithography and etch step upon said substrate;

performing a metal photolithography and etch step upon said substrate to deposit a thin layer thereof upon said substrate;

performing a metal photolithography and etch step upon said substrate to deposit a thick layer thereof upon said substrate;

performing a copper plating step upon said substrate; and thereafter performing a copper Chemical Mechanical Polishing (CMP) step upon said substrate.

11. A method for forming an electrical metal fuse for use with a semiconductor integrated circuit device, said method comprising the steps of:

forming at least two varying trench metal depths of a metal on a substrate to configure an electrical metal fuse thereon, wherein said at least two varying trench metal depths comprises at least two varying trench depths of copper;

configuring at least two different widths of single metal lines to generate an increase in current density gradients and thermal gradients thereof, such that said electrical metal fuse comprises a current density ratio greater than 10:1 and wherein said at least two different widths of single metal lines of a metal comprises at least one metal width that is thinner than at least one other metal width thereof.

12. The method of claim 11 wherein the steps of forming at least two varying trench metal depths of a metal on a substrate to configure an electrical metal fuse thereon and configuring at least two different widths of single metal lines to generate an increase in current density gradients and thermal gradients thereof, further comprises the steps of:

depositing at least one intermetal dielectric (IMD) layer upon said substrate;

thereafter performing a via photolithography and etch step upon said substrate;

performing a metal photolithography and etch step upon said substrate to deposit a thin layer thereof upon said substrate;

performing a metal photolithography and etch step upon said substrate to deposit a thick layer thereof upon said substrate;

performing a copper plating step upon said substrate; and thereafter performing a copper Chemical Mechanical Polishing (CMP) step upon said substrate.

* * * * *